(12) United States Patent
Low et al.

(10) Patent No.: US 11,557,799 B2
(45) Date of Patent: Jan. 17, 2023

(54) BACKUP BATTERY SYSTEM

(71) Applicants: LITE-ON ELECTRONICS (GUANGZHOU) LIMITED, Guangzhou (CN); Lite-On Technology Corporation, Taipei (TW)

(72) Inventors: Shin Yi Low, Taipei (TW); Wen-Lung Liang, Taipei (TW); Yi-Wei Chen, Taipei (TW); Wei-Hao Liang, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 367 days.

(21) Appl. No.: 16/935,157

(22) Filed: Jul. 21, 2020

(65) Prior Publication Data
US 2021/0399353 A1 Dec. 23, 2021

(30) Foreign Application Priority Data
Jun. 23, 2020 (TW) .................. 109121260

(51) Int. Cl.
*H01M 10/46* (2006.01)
*H01M 50/172* (2021.01)
*H02J 9/00* (2006.01)
*H02J 9/06* (2006.01)

(52) U.S. Cl.
CPC ......... *H01M 10/46* (2013.01); *H01M 50/172* (2021.01); *H02J 9/061* (2013.01)

(58) Field of Classification Search
CPC ....... H01M 10/46; H01M 50/172; H02J 9/061
USPC ................................. 320/107, 110, 112, 114
See application file for complete search history.

(56) References Cited

U.S. PATENT DOCUMENTS

| | | | | |
|---|---|---|---|---|
| 4,161,674 A * | 7/1979 | Maurer | .................. | H02J 9/065 315/86 |
| 4,709,201 A * | 11/1987 | Schaefer | ............... | H02J 7/0068 320/112 |
| 5,633,572 A * | 5/1997 | Steele | ....................... | H02J 9/00 361/728 |
| 5,827,050 A * | 10/1998 | Price | ....................... | H05B 3/58 62/149 |
| 6,700,352 B1 * | 3/2004 | Elliott | ................... | H02J 7/0013 320/130 |
| 7,612,529 B2 * | 11/2009 | Kochan, Jr. | ........... | H02J 7/0013 320/114 |
| 7,842,412 B2 * | 11/2010 | Zhang | ................. | H01M 50/209 429/96 |
| 7,948,745 B2 * | 5/2011 | Tang | ..................... | G06F 1/181 248/552 |

(Continued)

*Primary Examiner* — Phallaka Kik
(74) *Attorney, Agent, or Firm* — Jciprnet

(57) ABSTRACT

A backup battery system includes a charging-discharging module and a battery module. The charging-discharging module includes a first connector and a first engaging member. The battery module is detachably connected to the charging-discharging module and includes a second connector corresponding to the first connector and a second engaging member corresponding to the first engaging member. When the battery module is connected to the charging-discharging module, the first connector is joined with the second connector and the first engaging member is fixed to the second engaging member.

8 Claims, 15 Drawing Sheets

(56) References Cited

U.S. PATENT DOCUMENTS

| | | | | |
|---|---|---|---|---|
| 8,299,749 B2* | 10/2012 | Becker | ............... | H01M 10/44 320/110 |
| 11,006,718 B2* | 5/2021 | Bhatnagar | ............ | H02J 7/0045 |
| 11,211,654 B2* | 12/2021 | Zhang | ............... | H01M 8/0202 |
| 2004/0017824 A1* | 1/2004 | Koenck | ............... | H04L 69/326 370/466 |
| 2004/0183500 A1* | 9/2004 | Watanabe | ........... | H01M 10/465 320/101 |
| 2005/0024021 A1* | 2/2005 | Zeiler | ................. | H02J 7/0042 320/134 |
| 2006/0166083 A1* | 7/2006 | Zhang | ................. | H01M 50/209 429/97 |
| 2007/0005192 A1* | 1/2007 | Schoettle | ............... | H02J 9/062 700/286 |
| 2007/0035278 A1* | 2/2007 | Mullett | ................ | H02J 7/0071 320/130 |
| 2009/0154148 A1* | 6/2009 | Meyer | .................... | F21S 6/005 315/86 |
| 2009/0283103 A1* | 11/2009 | Nielsen | ................ | A24F 40/60 131/273 |
| 2010/0246121 A1* | 9/2010 | Tang | ....................... | G06F 1/181 361/679.58 |
| 2010/0291418 A1* | 11/2010 | Zhou | ................... | H01M 50/249 429/96 |
| 2011/0248681 A1* | 10/2011 | Miller | .................. | H02J 7/0018 320/126 |
| 2012/0098478 A1* | 4/2012 | Rich | ..................... | H01M 10/46 320/101 |
| 2012/0289074 A1* | 11/2012 | Chang | ................. | H01R 13/627 439/325 |
| 2013/0136956 A1* | 5/2013 | Nakano | ............... | H01M 50/213 429/7 |
| 2014/0057189 A1* | 2/2014 | Oh | .................... | H01M 8/04225 429/429 |
| 2014/0160652 A1* | 6/2014 | Cai | ..................... | H05K 7/1487 361/679.02 |
| 2015/0194833 A1* | 7/2015 | Fathollahi | ............. | H02J 7/0044 320/114 |
| 2015/0318725 A1* | 11/2015 | Brockman | ................ | H02J 7/00 320/162 |
| 2017/0232860 A1* | 8/2017 | Schlegel | ................ | B60L 53/14 180/65.1 |
| 2018/0104829 A1* | 4/2018 | Altman | ................. | H01M 10/46 |
| 2019/0075724 A1* | 3/2019 | Becke | .................... | H02J 7/0048 |
| 2019/0199101 A1* | 6/2019 | Hennesy | ............ | H02J 7/00712 |
| 2019/0267818 A1* | 8/2019 | Bonilla | .................... | H02J 7/0021 |
| 2019/0391617 A1* | 12/2019 | Shen | ..................... | G06F 1/1658 |
| 2020/0001448 A1* | 1/2020 | Donaldson | .......... | H01M 50/147 |
| 2020/0259343 A1* | 8/2020 | Hennesy | ................. | H02J 7/0044 |
| 2021/0184277 A1* | 6/2021 | Polchinski | .......... | H01M 10/425 |
| 2021/0345031 A1* | 11/2021 | DeMaio | ................ | H04R 1/1016 |
| 2022/0143847 A1* | 5/2022 | Bidram | ................ | B25J 19/0025 |

\* cited by examiner

BACKUP BATTERY SYSTEM

CROSS-REFERENCE TO RELATED APPLICATION

This application claims the priority benefit of Taiwan application serial no. 109121260, filed on Jun. 23, 2020. The entirety of the above-mentioned patent application is hereby incorporated by reference herein and made a part of this specification.

BACKGROUND

Technical Field

The disclosure relates to a battery system, and in particular, to a backup battery system.

Description of Related Art

In existing backup battery systems, the battery module and the charging-discharging module are integrally formed and fixed together. However, the life spans of the battery module and the charging-discharging module are different. If one of the modules fails, the whole device needs to be replaced, which causes waste. In addition, as the battery module cannot be replaced with one having a different battery capacity according to the requirements, the battery backup time is limited.

SUMMARY

The disclosure provides a backup battery system in which a battery module may be separated from a charging-discharging module.

A backup battery system of the disclosure includes a charging-discharging module and a battery module. The charging-discharging module includes a first connector and a first engaging member. The battery module is detachably connected to the charging-discharging module and includes a second connector corresponding to the first connector and a second engaging member corresponding to the first engaging member. When the battery module is connected to the charging-discharging module, the first connector is joined with the second connector, and the first engaging member is fixed to the second engaging member.

In an embodiment of the disclosure, one of the first engaging member and the second engaging member is an engaging hook, the other is an engaging hole, one of the charging-discharging module and the battery module that has the engaging hook further includes an elastic piece, and the elastic piece is linked with the engaging hook.

In an embodiment of the disclosure, the one of the charging-discharging module and the battery module that has the elastic piece further includes an exposed pressing part, and the pressing part is linked with the elastic piece.

In an embodiment of the disclosure, the charging-discharging module includes a first casing, the first engaging member is the engaging hook, the elastic piece is partially exposed from the first casing and the first engaging member is retractably disposed at the first casing, and the elastic piece is adapted to be pushed so that the first engaging member is exposed or retracted from the first casing.

In an embodiment of the disclosure, the battery module includes a second casing, and the second engaging member is the engaging hole formed on the second casing.

In an embodiment of the disclosure, the charging-discharging module includes a first casing, the first casing has a first stopper surface, the battery module includes a second casing, and the second casing has a second stopper surface corresponding to the first stopper surface.

In an embodiment of the disclosure, the first stopper surface is close to the first engaging member, and the second stopper surface is close to the second engaging member.

In an embodiment of the disclosure, one of the first engaging member and the second engaging member is an engaging hook, the other is an engaging hole, and the engaging hook is located on one of the first connector and the second connector.

In an embodiment of the disclosure, the charging-discharging module includes a first casing, the battery module includes a second casing, the first engaging member is the engaging hook, the first engaging member is located on the first connector and is exposed from the first casing, the second engaging member is the engaging hole, and the second engaging member is formed on the second casing.

In an embodiment of the disclosure, the one of the first engaging member and the second engaging member that is the engaging hook has a slope surface. When the battery module is to be connected to the charging-discharging module, one of the charging-discharging module and the battery module that has the engaging hole pushes the slope surface so that the engaging hook is retracted, until the engaging hook extends into the engaging hole.

In an embodiment of the disclosure, the first engaging member is located on an outer side of the first connector and is integrally formed with the first connector.

In an embodiment of the disclosure, the backup battery system is disposed on a server cabinet.

In an embodiment of the disclosure, one of the charging-discharging module and the battery module includes a positioning column, the other has a positioning slot, and when the battery module is connected to the charging-discharging module, the positioning column extends into the positioning slot.

In an embodiment of the disclosure, the first engaging member and the second engaging member are two engaging hooks, the first engaging member is located on the first connector, and the second engaging member is located on the second connector.

In an embodiment of the disclosure, one of the charging-discharging module and the battery module further includes a pressing part linked with its own engaging hook, the other includes a casing, the casing has an opening, and when the battery module is connected to the charging-discharging module, the pressing part is located in the opening.

Based on the above, the battery module of the backup battery system of the disclosure is detachably connected to the charging-discharging module. When the battery module is connected to the charging-discharging module, the first connector is joined with the second connector to be electrically connected to each other. In addition, the first engaging member is fixed to the second engaging member so that the battery module is securely connected to the charging-discharging module to maintain the stability of charge and discharge. Moreover, the battery module may be separated from the charging-discharging module to replace the failed module or to connect the battery module having a different battery capacity to the charging-discharging module, which provides more flexibility in use.

To make the aforementioned more comprehensible, several embodiments accompanied with drawings are described in detail as follows.

DESCRIPTION OF THE EMBODIMENTS

Figure 1:
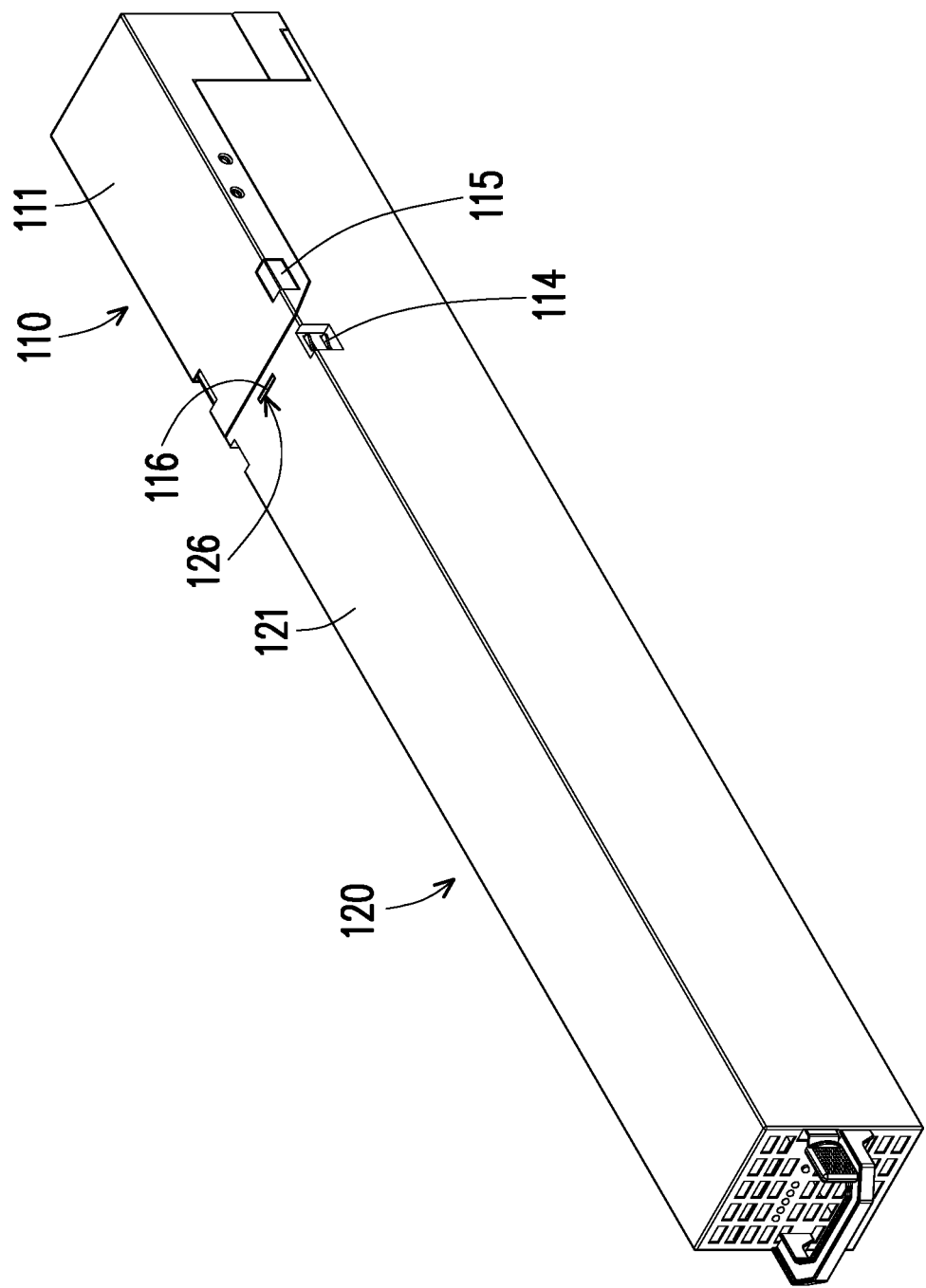
FIG. 1 is a schematic view showing a backup battery system according to an embodiment of the disclosure.
Figure 2:
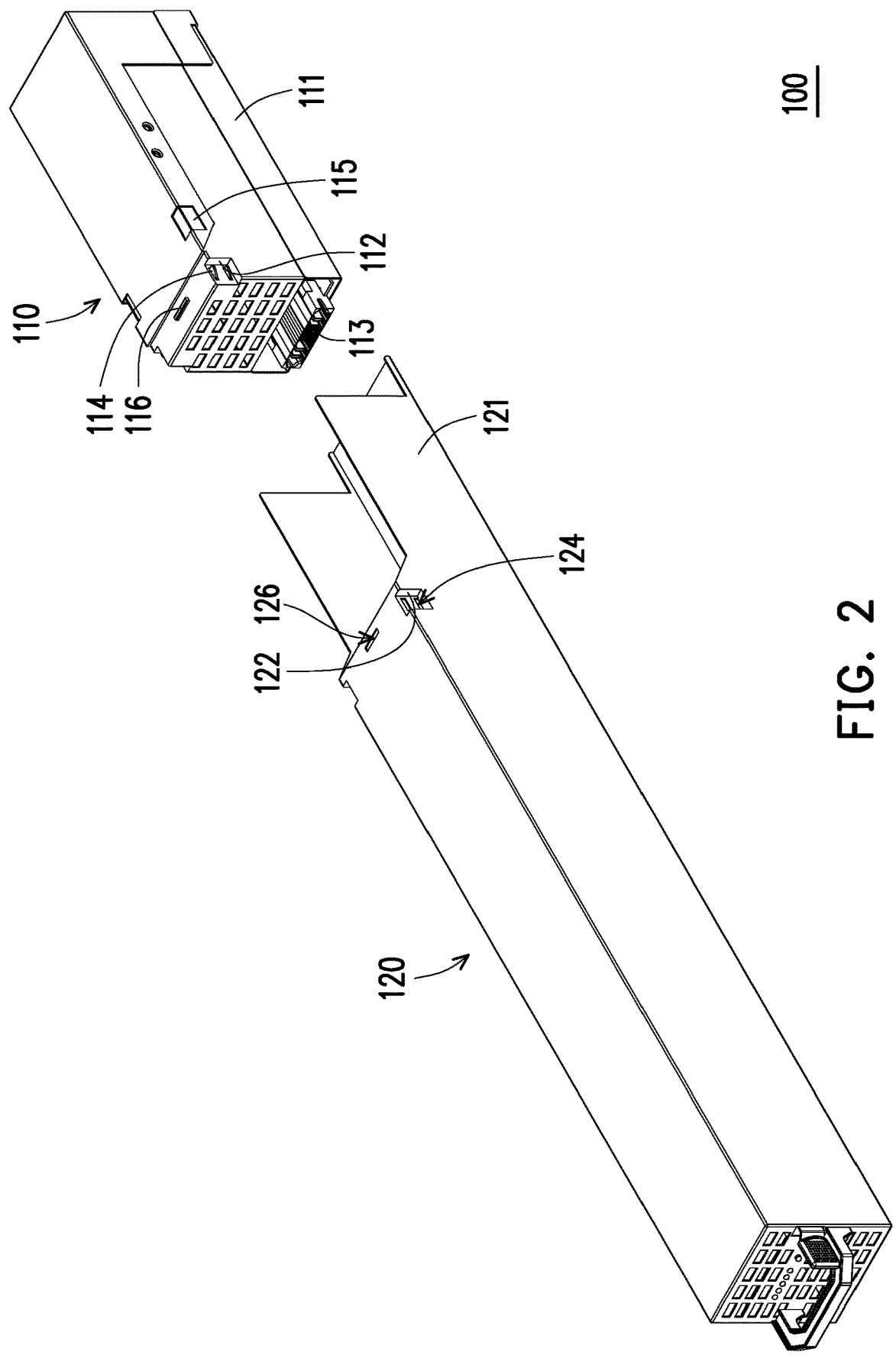
FIG. 2 is a schematic view showing a charging-discharging module of the backup battery system of FIG. 1 detached from a battery module.
Figure 3:
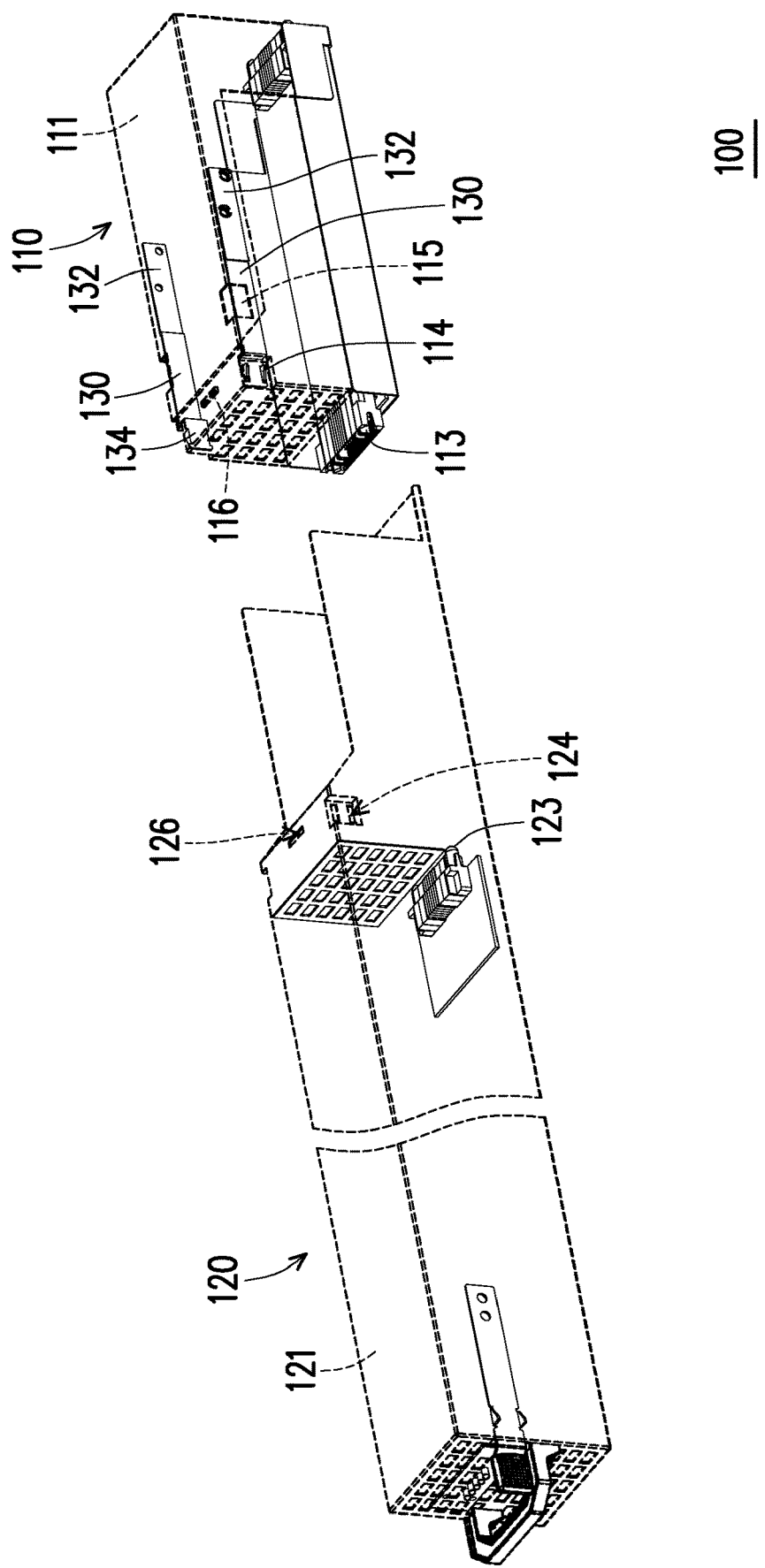
FIG. 3 is a schematic perspective view of FIG. 2.
Figure 4A:
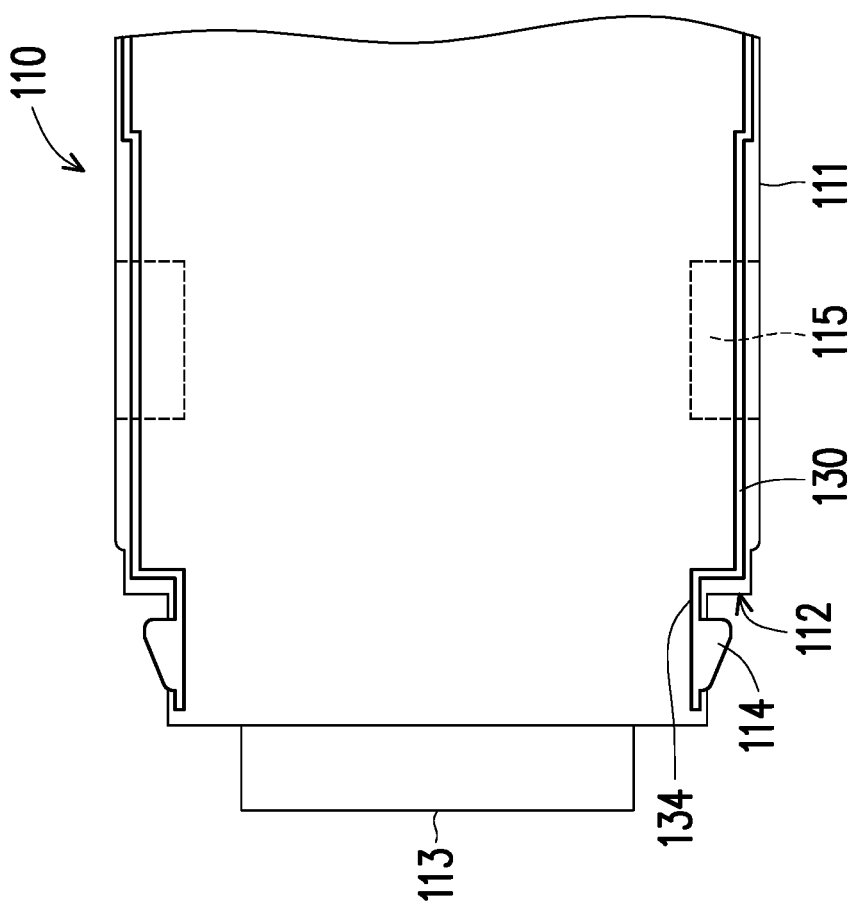
FIG. 4A is a partial schematic top view showing the charging-discharging module of the backup battery system of FIG. 1.

FIG. 1 is a schematic view showing a backup battery system according to an embodiment of the disclosure. FIG. 2 is a schematic view showing a charging-discharging module of the backup battery system of FIG. 1 detached from a battery module. FIG. 3 is a schematic perspective view of FIG. 2. FIG. 4A is a partial schematic top view showing the charging-discharging module of the backup battery system of FIG. 1.

Referring to FIG. 1 to FIG. 4A, in this embodiment, a backup battery system 100 may be disposed on a server cabinet (not shown), e.g., an OCP server cabinet. In other words, the backup battery system 100 of this embodiment may serve as a backup battery system of a server system and may support uninterrupted power supply of the server system, but the application of the backup battery system 100 is not limited thereto.

The backup battery system 100 of this embodiment includes a charging-discharging module 110 and a battery module 120. The battery module 120 is detachably connected to the charging-discharging module 110. As shown in FIG. 3, the charging-discharging module 110 includes a first connector 113 and a first engaging member 114. The battery module 120 includes a second connector 123 corresponding to the first connector 113 and a second engaging member 124 corresponding to the first engaging member 114.

In this embodiment, one of the first engaging member 114 and the second engaging member 124 is an engaging hook, and the other is an engaging hole. In addition, one of the charging-discharging module 110 and the battery module 120 that has the engaging hook further includes an elastic piece 130, and the elastic piece 130 is linked with the engaging hook. FIG. 3 shows an embodiment in which the elastic piece 130 is provided in the charging-discharging module 110.

More specifically, the charging-discharging module 110 includes a first casing 111, and a pressing part 115 which is exposed from the first casing 111 and is movable relative to the first casing 111, and the first engaging member 114 is an engaging hook. In addition, the battery module 120 includes a second casing 121, and the second engaging member 124 is an engaging hole formed on the second casing 121.

As shown in FIG. 3, the elastic piece 130 includes a first end 132 and a second end 134 opposite to each other, the elastic piece 130 is fixed to the first casing 111 through the first end 132, and the pressing part 115 is located next to the elastic piece 130 and is located between the first end 132 and the second end 134. As shown in FIG. 4A, the first engaging member 114 is connected to the second end 134 of the elastic piece 130 and is retractably disposed at the first casing 111 to expose from the first casing 111 or retract into the first casing 111.

Of course, in other embodiments, the first engaging member 114 of the charging-discharging module 110 may also be an engaging hole, the second engaging member 124 of the battery module 120 may also be an engaging hook, and the elastic piece 130 may also be provided on the battery module 120, which are not limited to the illustration in the drawings herein.

Figure 4B:
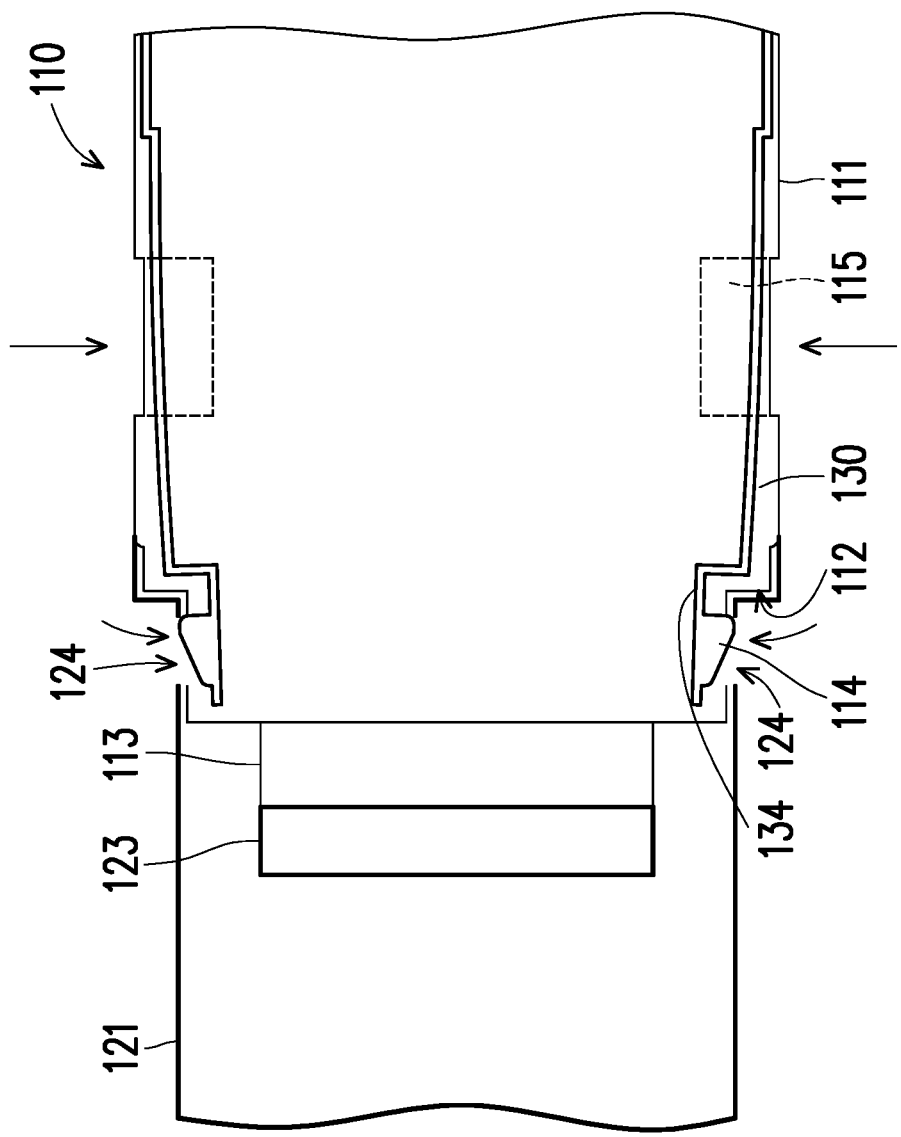
FIG. 4B is a partial schematic view showing the pressing part of FIG. 4A being pressed and the charging-discharging module being connected to the battery module.
Figure 4C:
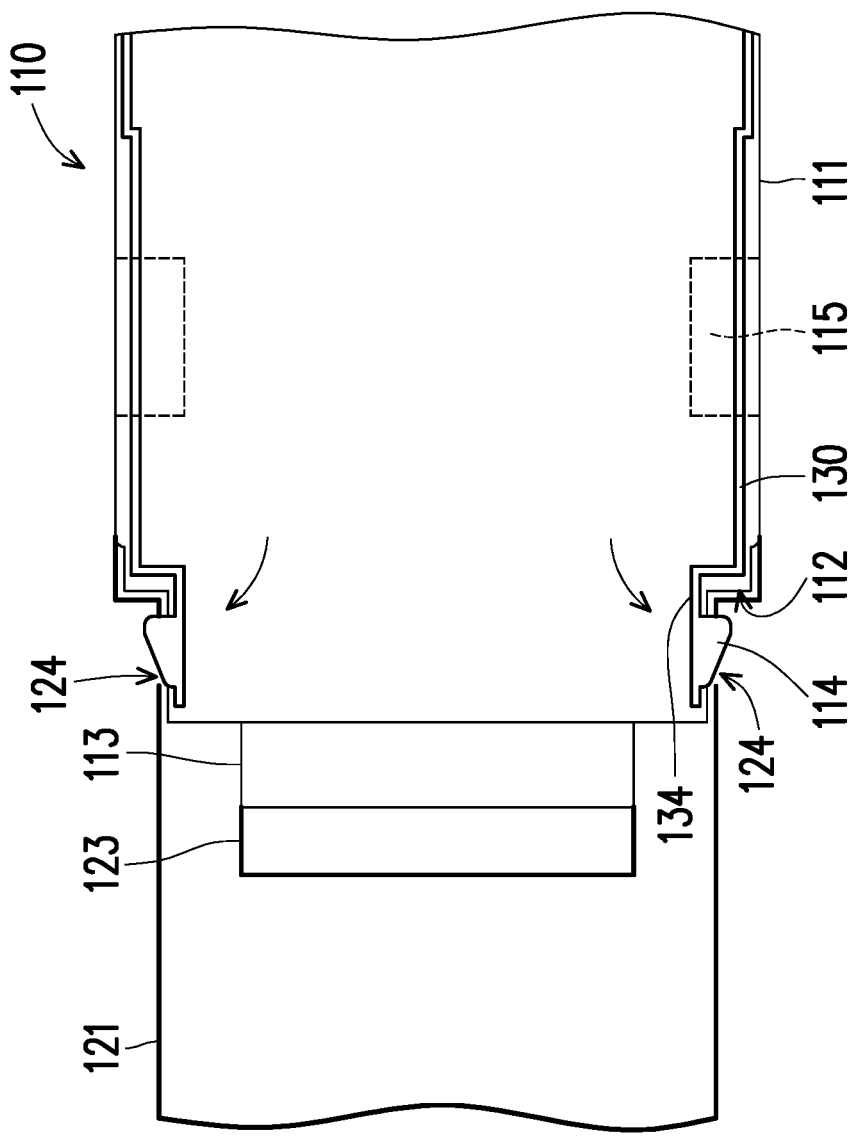
FIG. 4C is a schematic view showing the pressing part in FIG. 4B being released.

FIG. 4B is a partial schematic view showing the pressing part of FIG. 4A being pressed and the charging-discharging module being connected to the battery module. FIG. 4C is a schematic view showing the pressing part in FIG. 4B being released. When the charging-discharging module 110 is to be connected to the battery module 120, a user may press the pressing part 115 as shown in FIG. 4B, and the elastic piece 130 is correspondingly pushed inward, so that the first engaging member 114 is retracted into the first casing 111 to prevent the charging-discharging module 110 from interfering with the second casing 121 of the battery module 120 in the joining process, until the first connector 113 is joined with the second connector 123.

At this time, the user may release the pressing part 115 as shown in FIG. 4C. The elastic piece 130 will return its original position and move outward, and the first engaging member 114 will protrude from the first casing 111 along with the movement of the elastic piece 130 and extend into the second engaging member 124. Accordingly, the first engaging member 114 is fixed to the second engaging member 124, so that the battery module 120 is securely connected to the charging-discharging module 110. Therefore, the battery module 120 and the charging-discharging module 110 can be disposed on the server cabinet as a whole.

When the charging-discharging module 110 is to be separated from the battery module 120, the user may simply press the pressing part 115 and move the charging-discharging module 110 away from the battery module 120, and then the first engaging member 114 will retract without interfering with the second engaging member 124, so that the charging-discharging module 110 can be moved out of the battery module 120.

Therefore, in this embodiment, when the battery module 120 or the charging-discharging module 110 fails or the battery module 120 having a different capacity needs to be replaced, the battery module 120 may be separated from the charging-discharging module 110 to replace the failed module or to connect the battery module 120 having a different battery capacity to the charging-discharging module 110. Accordingly, the disclosure provides more flexibility in use.

In addition, as the first engaging member 114 and the second engaging member 124 are located on the side surfaces of the first casing 111 and the second casing 121, in order to fix to each other more securely, in this embodiment, the charging-discharging module 110 may optionally include a positioning column 116 (referring to FIG. 3), and the battery module 120 may also optionally include a positioning slot 126. As shown in FIG. 1, when the battery module 120 is connected to the charging-discharging module 110, the positioning column 116 will extend into the positioning slot 126.

In this embodiment, the positioning column 116 and the positioning slot 126 are located on the top surfaces of the first casing 111 and the second casing 121 and work with the first engaging member 114 and the second engaging member 124 on the side surfaces of the first casing 111 and the second casing 121, so that different fixing or positioning structures are provided on different surfaces of the first casing 111 and the second casing 121 to further improve the fixedness of the first casing 111 and the second casing 121.

It is noted that, in order to prevent damage to the first connector 113 and the second connector 123 resulting from an excessively large force of joining the battery module 120 and the charging-discharging module 110, in this embodiment, the first casing 111 of the charging-discharging module 110 further includes a first stopper surface 112 (referring to FIG. 2), and the second casing 121 of the battery module 120 further includes a second stopper surface 122 corresponding to the first stopper surface 112. In this embodiment, the first stopper surface 112 is close to the first engaging member 114, and the second stopper surface 122 is close to the second engaging member 124, but the disclosure is not limited thereto.

When the battery module 120 is connected to charging-discharging module 110, the first stopper surface 112 and the second stopper surface 122 limit the degree of closeness between the battery module 120 and the charging-discharging module 110 to prevent damage to the first connector 113 and the second connector 123 resulting from excessive closeness between the battery module 120 and the charging-discharging module 110.

Another embodiment of the backup battery system will be described below. In the description below, only the main difference from the previous embodiment will be described, and components identical or similar to those in the previous embodiment will be labeled with the same or similar numerals and will not be repeatedly described.

Figure 5:
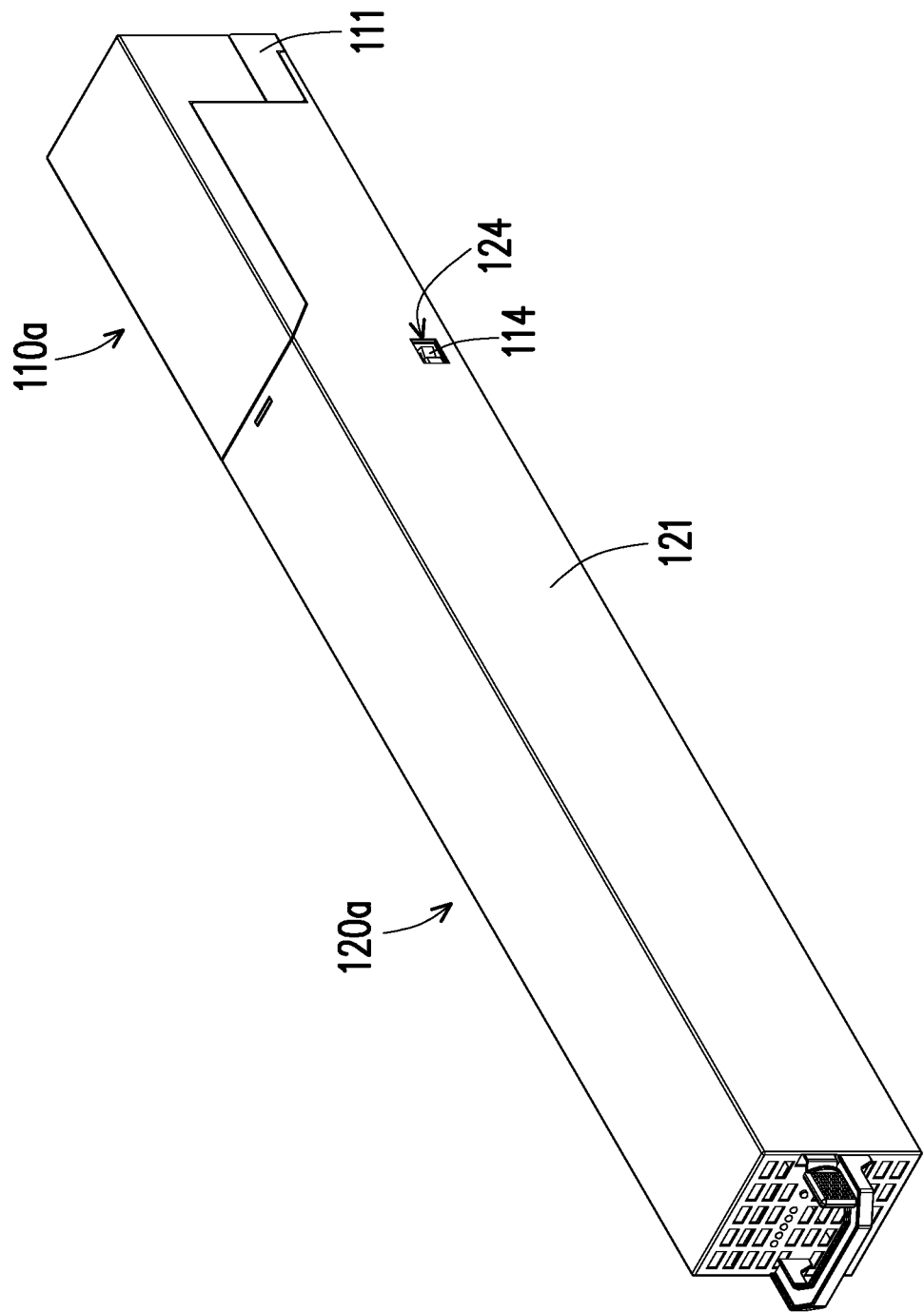
FIG. 5 is a schematic view showing a backup battery system according to another embodiment of the disclosure.
Figure 6:
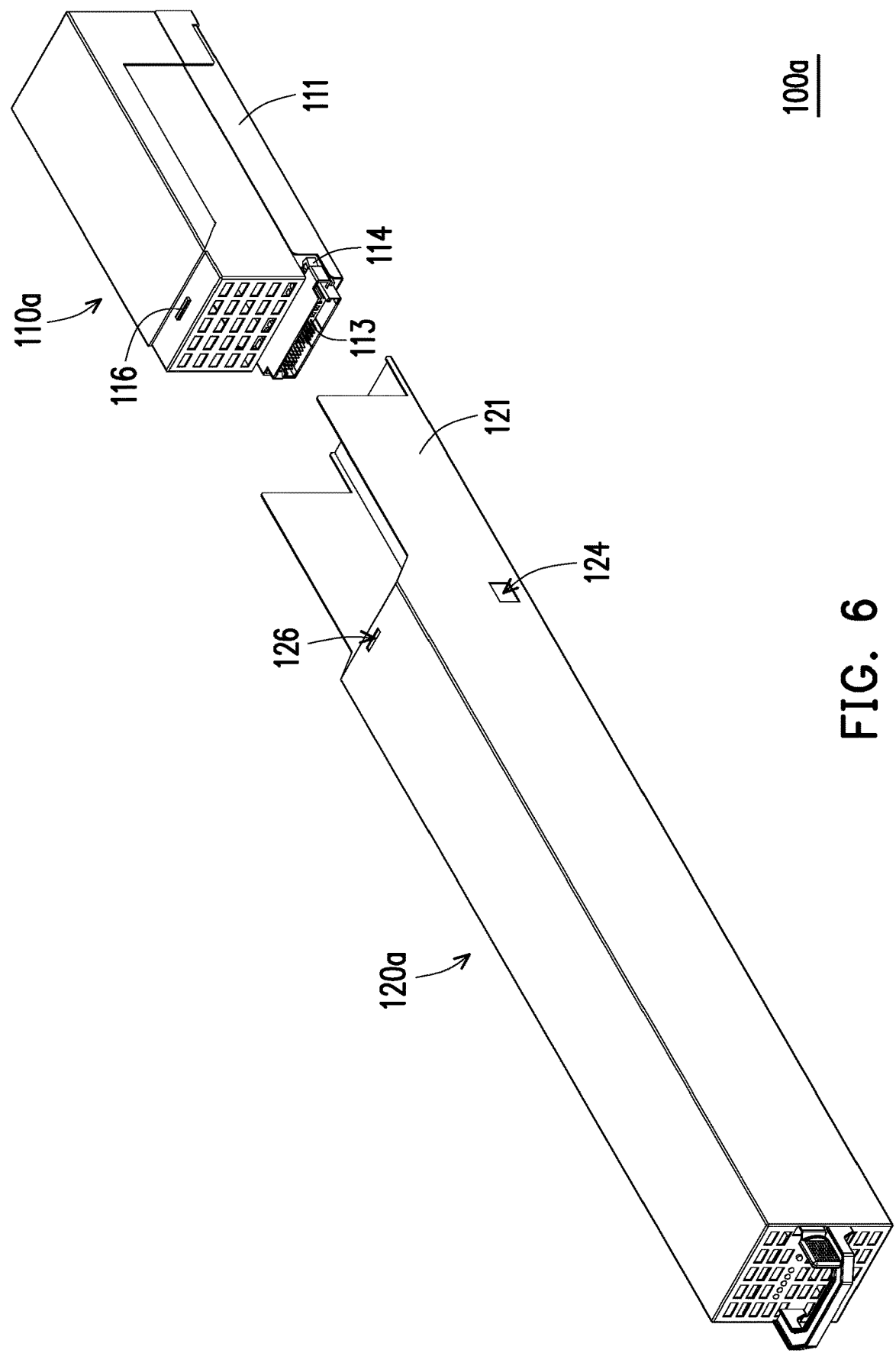
FIG. 6 is a schematic view showing a charging-discharging module of the backup battery system of FIG. 5 detached from a battery module.
Figure 7:
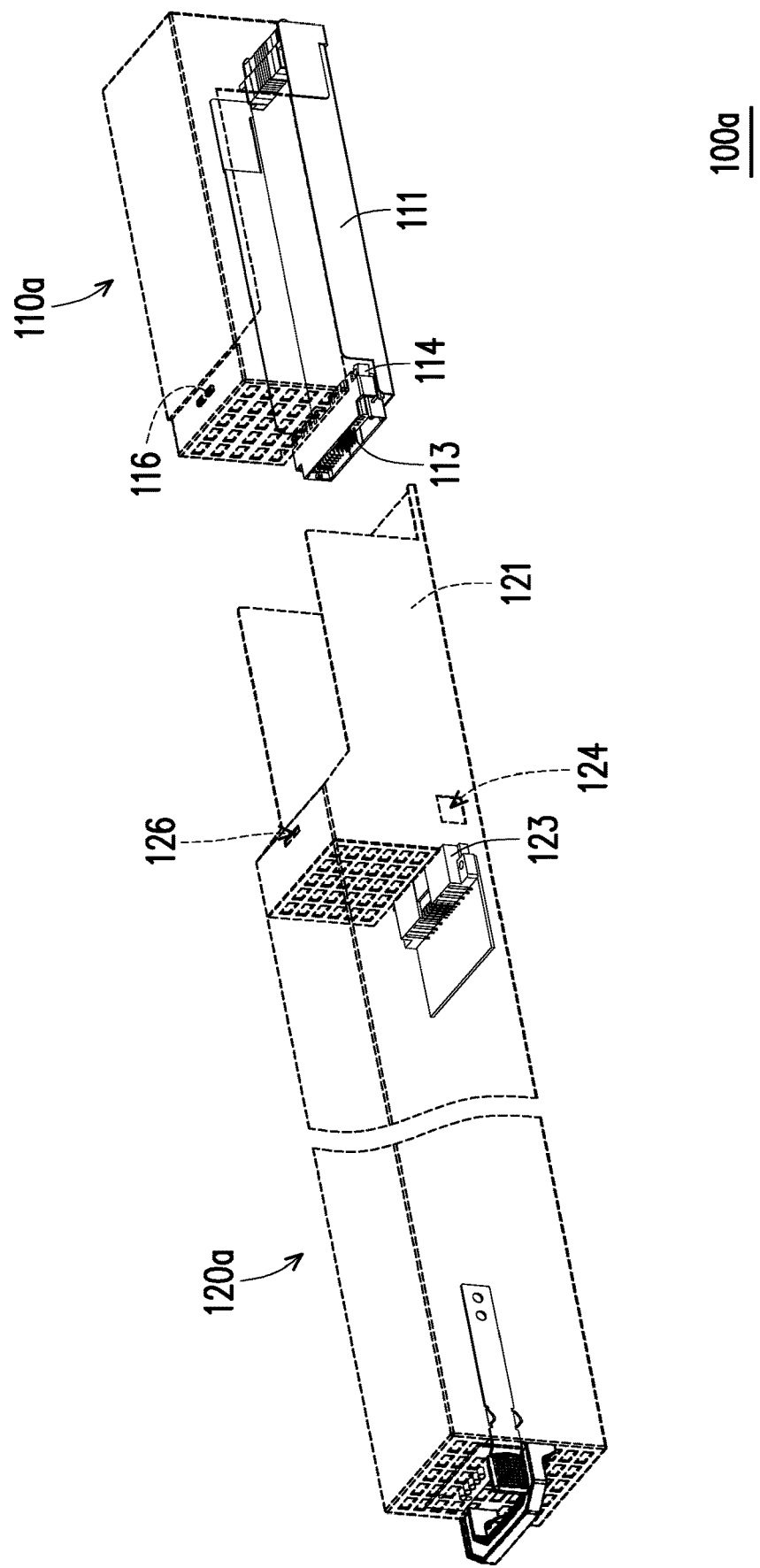
FIG. 7 is a schematic perspective view of FIG. 6.
Figure 8A:
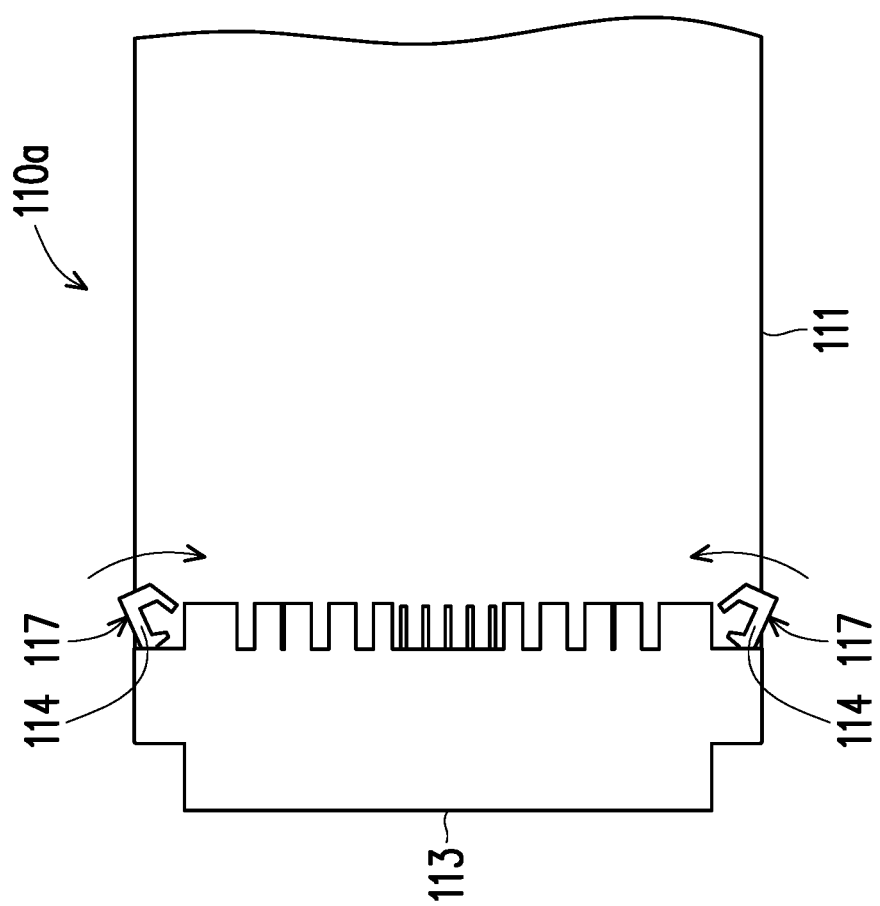
FIG. 8A is a partial schematic top view showing the charging-discharging module of the backup battery system of FIG. 5.

FIG. 5 is a schematic view showing a backup battery system according to another embodiment of the disclosure. FIG. 6 is a schematic view showing a charging-discharging module of the backup battery system of FIG. 5 detached from a battery module. FIG. 7 is a schematic perspective view of FIG. 6. FIG. 8A is a partial schematic top view showing the charging-discharging module of the backup battery system of FIG. 5.

Referring to FIG. 5 to FIG. 8A, the main difference of a charging-discharging module 110a and a battery module 120a of a backup battery system 100a of this embodiment from the previous embodiment lies in that, in this embodiment, one of the first engaging member 114 and the second engaging member 124 that is an engaging hook is located on the first connector 113 or the second connector 123.

Figure 8B:
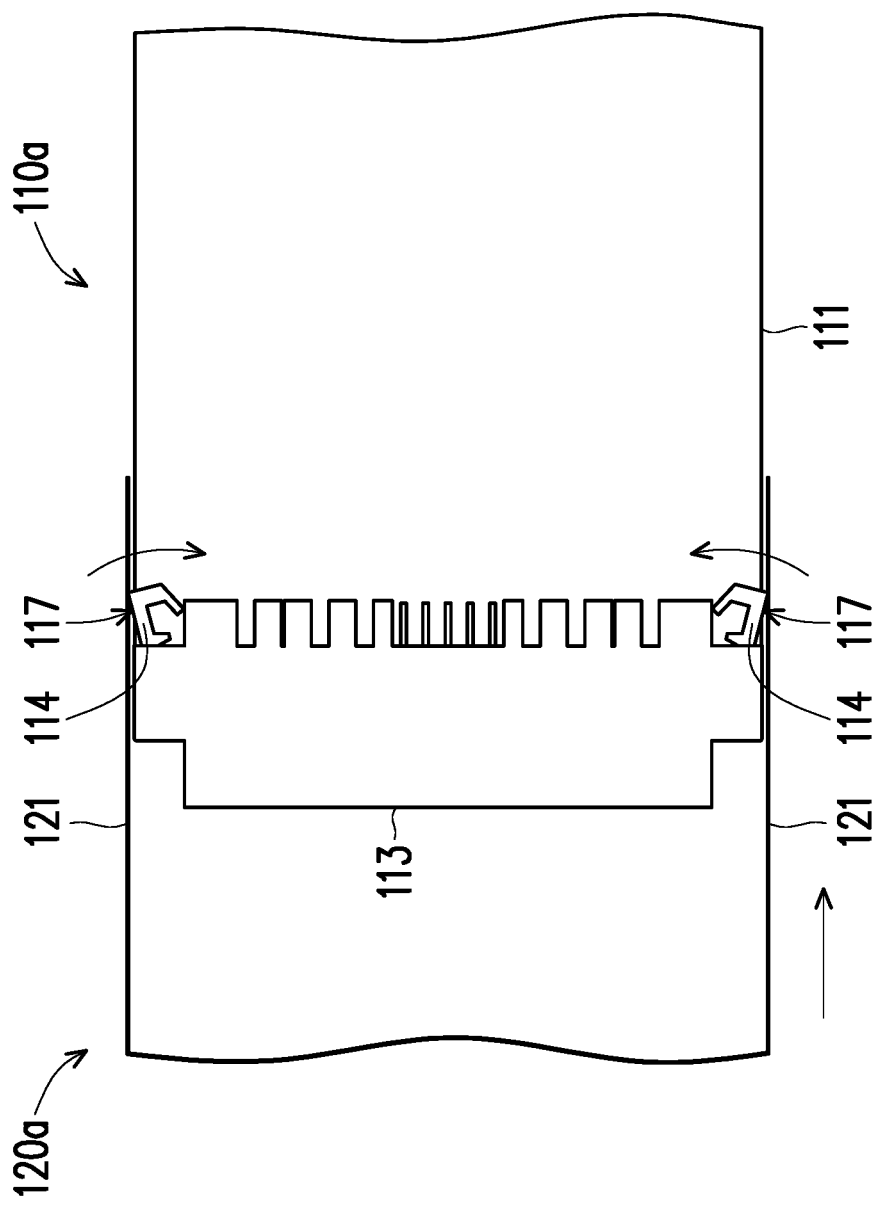
FIG. 8B to FIG. 8C are partial schematic views showing a connection process of the charging-discharging module and the battery module of FIG. 5.
Figure 8C:
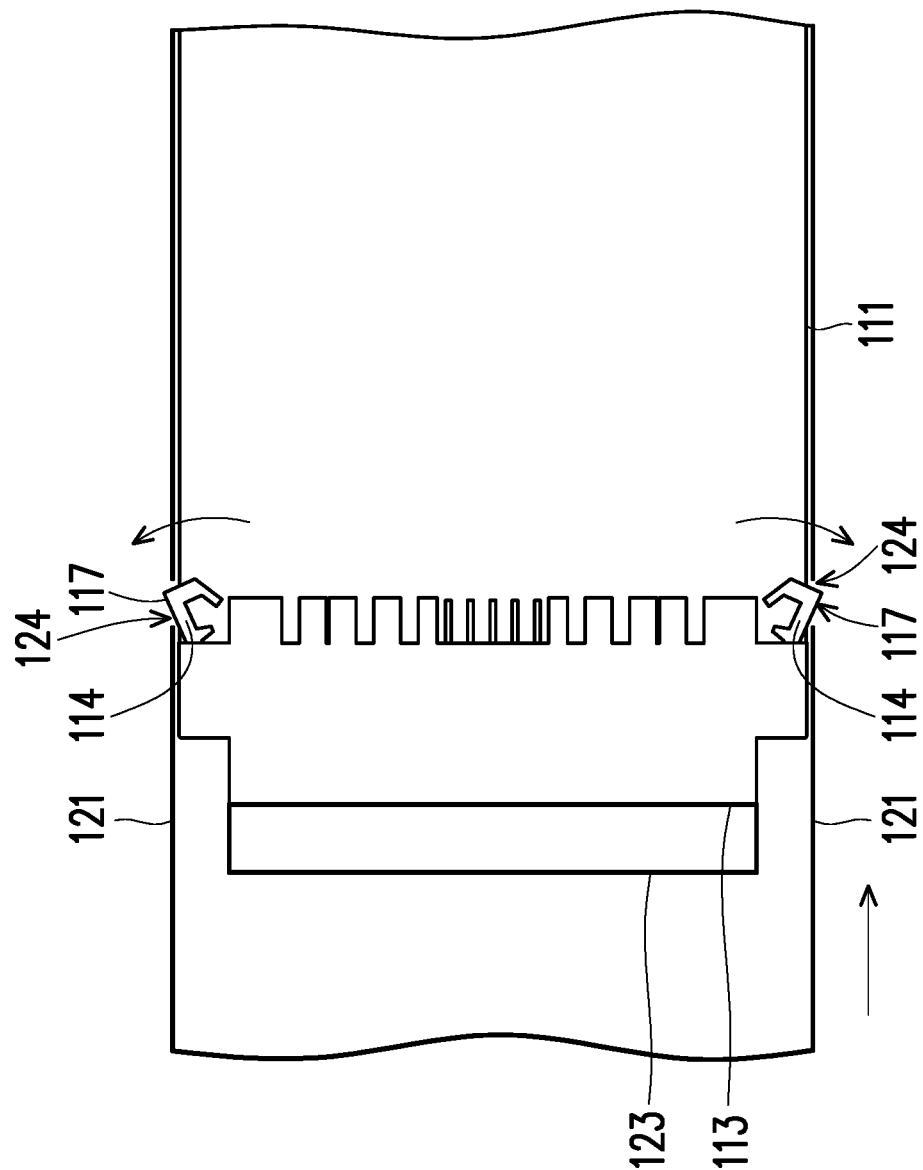

Specifically, in this embodiment, the first engaging member 114 is an engaging hook, and the first engaging member 114 is located on the first connector 113 and is particularly located on the outer side of the first connector 113 and is exposed to the first casing 111. The first engaging member 114 and the first connector 113 may be integrally formed with each other or may be separately manufactured and fixed together. As shown in FIG. 8A, the first engaging member 114 is similar to the elastic piece 130 and is flexible, and the first engaging member 114 protrudes slightly from the first casing 111 in a normal state and may be pressed inward so that it does not protrude from the first casing 111. FIG. 8B to FIG. 8C are partial schematic views showing a connection process of the charging-discharging module and the battery module of FIG. 5. As shown in FIG. 8B, when the battery module 120a is to be connected to the charging-discharging module 110a, since the first engaging member 114 protrudes from the outer side of the first connector 113, the second casing 121 will push a slope surface 117 of the first engaging member 114, so that the first engaging member 114 is retracted until, as shown in FIG. 8C, the first engaging member 114 moves to the second engaging member 124 (engaging hole) of the second casing 121, and the first engaging member 114 is not restricted by the second casing 121 and extends into the second engaging member 124. Accordingly, the first engaging member 114 is fixed to the second engaging member 124, and the battery module 120a is securely connected to the charging-discharging module 110a.

Figure 8D:
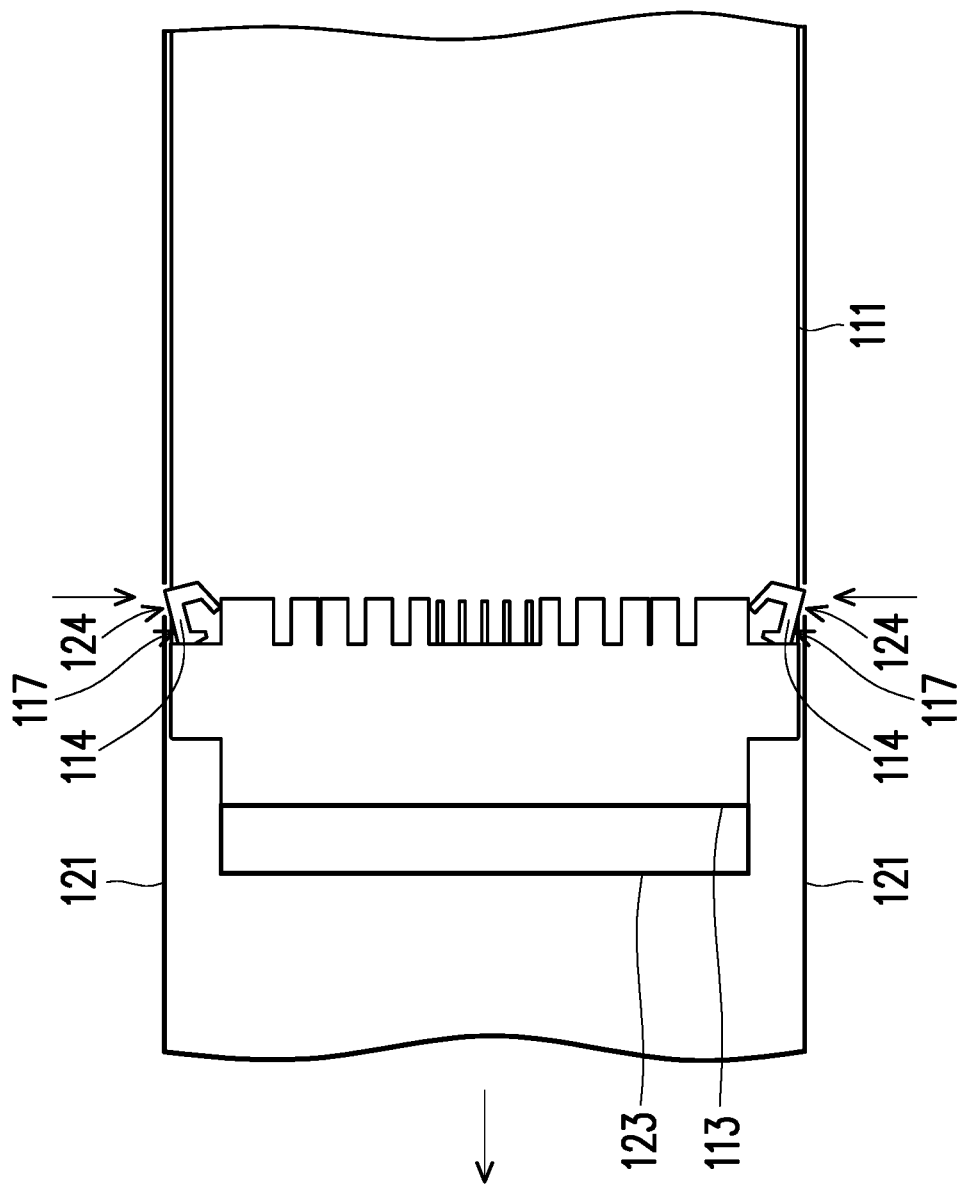
FIG. 8D is a partial schematic view showing the charging-discharging module of FIG. 5 starting to be separated from the battery module.

FIG. 8D is a partial schematic view showing the charging-discharging module of FIG. 5 starting to be separated from the battery module. When the charging-discharging module 110a is to be separated from the battery module 120a, the user may simply press the first engaging member 114 as shown in FIG. 8D and moves the charging-discharging module 110a away from the battery module 120a, and then the first engaging member 114 will retract as shown in FIG. 8B and move against the inner surface of the second casing 121, so that the charging-discharging module 110a can be moved out of the battery module 120a.

Of course, the positions of the engaging hook and the engaging hole may also be interchanged and are not limited to the illustration in the drawings. In an embodiment not shown, the second engaging member of the battery module may also be an engaging hook located on the second connector, and the first engaging member of the charging-discharging module may also be an engaging hole. When the battery module is to be connected to the charging-discharging module, the first casing 111 of the charging-discharging module will push the slope surface of the second engaging member, so that the second engaging member is retracted until the second engaging member moves to the first engaging member (engaging hole) of the first casing 111.

Figure 9:
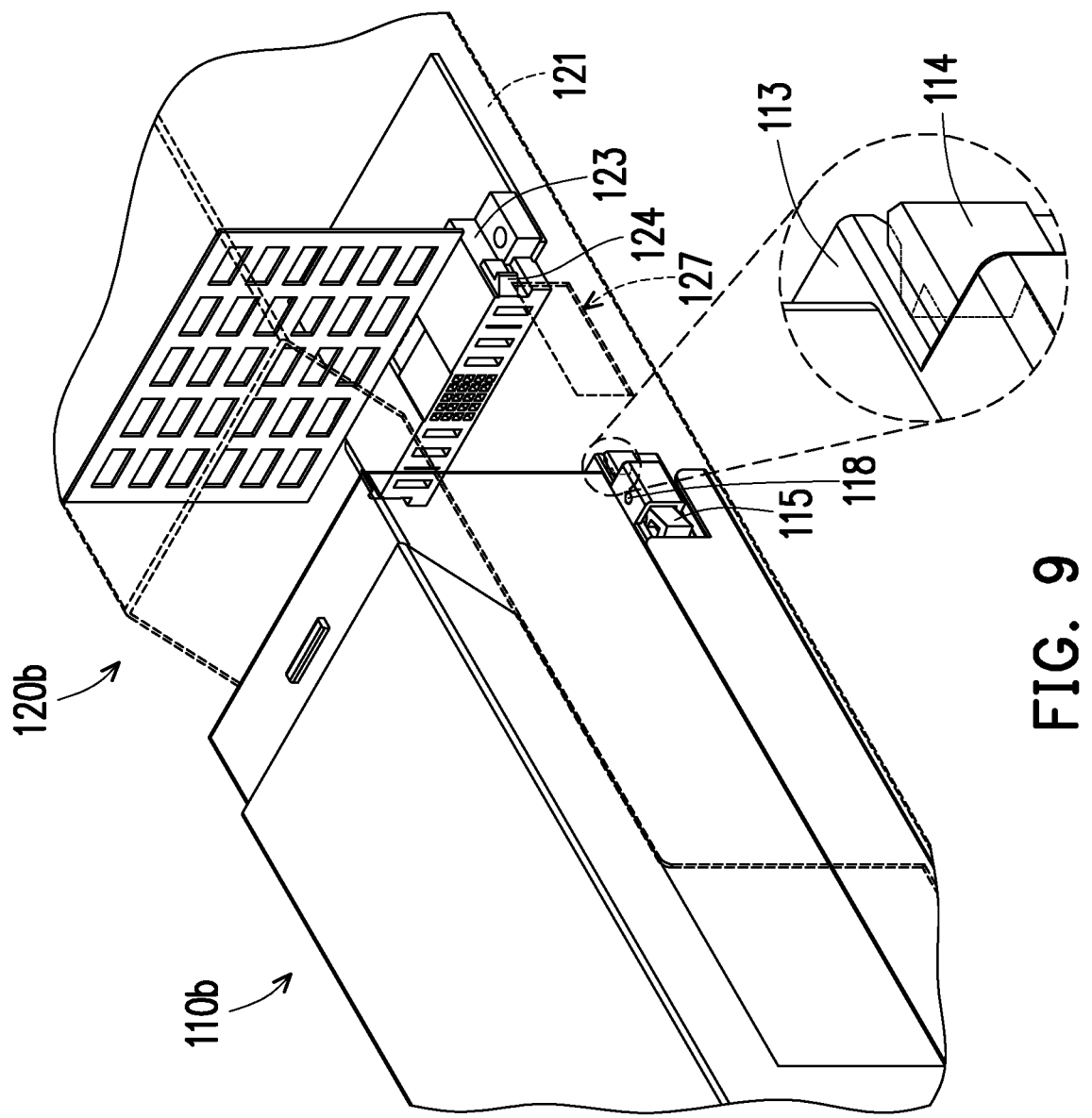
FIG. 9 is a partial schematic view showing a charging-discharging module of a backup battery system detached from a battery module according to another embodiment of the disclosure.
Figure 10:
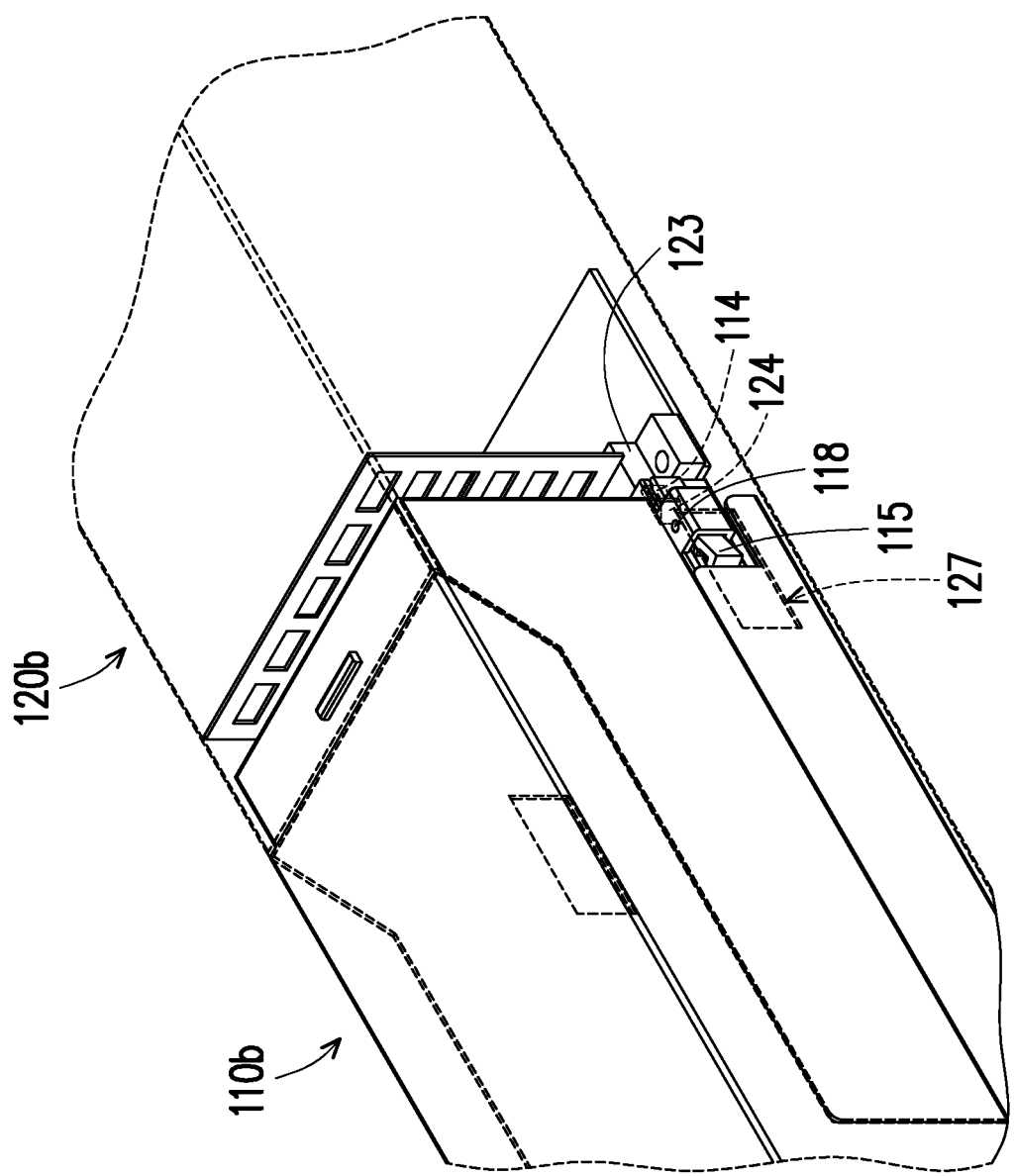
FIG. 10 is a partial schematic view showing the charging-discharging module of the backup battery system of FIG. 9 connected to the battery module.

FIG. 9 is a partial schematic view showing a charging-discharging module of a backup battery system detached from a battery module according to another embodiment of the disclosure. FIG. 10 is a partial schematic view showing the charging-discharging module of the backup battery system of FIG. 9 connected to the battery module.

Referring to FIG. 9 and FIG. 10, in this embodiment, the first engaging member 114 of a charging-discharging module 110b and the second engaging member 124 of a battery module 120b are two engaging hooks. One of the charging-discharging module 110b and the battery module 120b further includes a pressing part 115 linked with its own engaging hook. The other includes a casing, and the casing has an opening 127. When the battery module 120b is connected to the charging-discharging module 110b, the pressing part 115 is located in the opening 127. Specifically, in this embodiment, the charging-discharging module 110b includes the pressing part 115 linked with the first engaging member 114, and a pivot 118 is provided between the first engaging member 114 and the pressing part 115. The user may press the pressing part 115 to control the position of the first engaging member 114. The relevant pressing method has been as described above and will not be repeatedly described herein. The second casing 121 of the battery module 120b has an opening 127, and the position of the opening 127 corresponds to the pressing part 115. When the battery module 120b is connected to the charging-discharging module 110b, the pressing part 115 may be located in the opening 127 to expose the pressing part 115.

Accordingly, as shown in FIG. 10, when the battery module 120b is connected to the charging-discharging module 110b, the first engaging member 114 of the charging-discharging module 110b is engaged with the second engaging member 124 of the battery module 120b to fix to each other. In addition, as the pressing part 115 is exposed, when the user is to separate the battery module 120b from the charging-discharging module 110b, the user may simply press the pressing part 115, so that the first engaging member 114 can be disengaged from the second engaging member 124 and can be detached smoothly.

In summary of the above, the battery module of the backup battery system of the disclosure is detachably connected to the charging-discharging module. When the battery module is connected to the charging-discharging module, the first connector is joined with the second connector to be electrically connected to each other. In addition, the first engaging member is fixed to the second engaging member so that the battery module is securely connected to the charging-discharging module to maintain the stability of charge and discharge. Moreover, the battery module may be separated from the charging-discharging module to replace the failed module or to connect the battery module having a different battery capacity to the charging-discharging module, which provides more flexibility in use.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A backup battery system comprising:
    a charging-discharging module comprising a first connector and a first engaging member; and
    a battery module detachably connected to the charging-discharging module and comprising a second connector corresponding to the first connector and a second engaging member corresponding to the first engaging member, wherein when the battery module is connected to the charging-discharging module, the first connector is joined with the second connector, and the first engaging member is fixed to the second engaging member, wherein one of the first engaging member and the second engaging member is an engaging hook, the other is an engaging hole, one of the charging-discharging module and the battery module that has the engaging hook further comprises an elastic piece, and the elastic piece is linked with the engaging hook.

2. The backup battery system according to claim 1, wherein the one of the charging-discharging module and the battery module that has the elastic piece further comprises an exposed pressing part, and the pressing part is linked with the elastic piece.

3. The backup battery system according to claim 1, wherein the charging-discharging module comprises a first casing, the first engaging member is the engaging hook, the elastic piece is partially exposed from the first casing and the first engaging member is retractably disposed at the first casing, and the elastic piece is adapted to be pushed so that the first engaging member is exposed or retracted from the first casing.

4. The backup battery system according to claim 3, wherein the battery module comprises a second casing, and the second engaging member is the engaging hole formed on the second casing.

5. The backup battery system according to claim 1, wherein the charging-discharging module comprises a first casing, the first casing has a first stopper surface, the battery module comprises a second casing, and the second casing has a second stopper surface corresponding to the first stopper surface.

6. The backup battery system according to claim 5, wherein the first stopper surface is close to the first engaging member, and the second stopper surface is close to the second engaging member.

7. The backup battery system according to claim 1, wherein the backup battery system is disposed on a server cabinet.

8. The backup battery system according to claim 1, wherein one of the charging-discharging module and the battery module comprises a positioning column, the other has a positioning slot, and when the battery module is connected to the charging-discharging module, the positioning column extends into the positioning slot.

* * * * *